United States Patent [19]

Becker, deceased et al.

[11] Patent Number: 4,553,811

[45] Date of Patent: Nov. 19, 1985

[54] OPTOELECTRICAL COUPLING ARRANGEMENT

[75] Inventors: Reinhard Becker, deceased, late of Senden-Ay; Gudula Seber, legal representative, Bielefeld; Ulrich Becker, legal representative, Blaustein; Hans C. Becker, legal representative, Trier-Irsch; Gero Becker, legal representative, Sarstedt-Gödringen; Artur Müssigmann, Ehingen; Anton Schurr, Senden-Wullenstetten, all of Fed. Rep. of Germany

[73] Assignee: Licentia Patent-Verwaltungs-GmbH, Frankfurt am Main, Fed. Rep. of Germany

[21] Appl. No.: 427,893

[22] Filed: Sep. 29, 1982

[30] Foreign Application Priority Data

Oct. 29, 1981 [DE] Fed. Rep. of Germany ........ 3142918

[51] Int. Cl.[4] .............................................. G02B 7/26
[52] U.S. Cl. .................................... 350/96.20; 357/30
[58] Field of Search .................... 350/96.15, 96.20; 250/227; 357/30

[56] References Cited

U.S. PATENT DOCUMENTS

| 4,030,811 | 6/1977 | Khoe et al. | 350/96.17 |
| 4,152,713 | 5/1979 | Copeland, III et al. | 350/96.11 |
| 4,186,994 | 2/1980 | Denkin et al. | 350/96.17 |
| 4,201,443 | 5/1980 | Hodge | 350/96.20 |
| 4,210,923 | 7/1980 | North et al. | 357/30 |
| 4,216,486 | 8/1980 | Geddes | 357/30 |
| 4,225,213 | 9/1980 | McBride, Jr. et al. | 350/96.20 |
| 4,279,465 | 7/1981 | Vojvodich | 350/96.20 |
| 4,373,778 | 2/1983 | Adham | 350/96.20 |

OTHER PUBLICATIONS

Comerford, IBM Technical Disclosure Bulletin, vol. 22, No. 7, Dec. 1979, "Etched Silicon Structure for Aligning a Photodiode and Optical Fiber", pp. 2935-2936.

Cefarelli et al., IBM Technical Disclosure Bulletin, vol. 21, No. 4, Sep. 1978, "Optical Circuit Module Connector", pp. 1568-1570.

Noel et al., IBM Tech. Disc. Bull., vol. 22, No. 11, Apr. 1980, "High Density Fiber-Optic Transducer Modules", pp. 4857-4858.

Primary Examiner—William J. Sikes
Assistant Examiner—Frank González
Attorney, Agent, or Firm—Spencer & Frank

[57] ABSTRACT

Optoelectrical coupling arrangement composed of a carrier element having a side face and provided with at least one trough-shaped recess extending to the side face, at least one beam waveguide element fastened in the recess and presenting an end face positioned to lie in the region of the one side face of the carrier element, and at least one photodetector fastened to the side face and having a light-sensitive region positioned to receive a substantial portion of the light emanating from the end face of the beam waveguide element. The carrier element comprises at least one electrical conductive path connected electrically to the photodetector.

11 Claims, 5 Drawing Figures

OPTOELECTRICAL COUPLING ARRANGEMENT

BACKGROUND OF THE INVENTION

The present invention relates to an optoelectrical coupling arrangement of the type including a beam waveguide, or optical fiber, coupled to a photodetector.

Such a coupling arrangement can be used, in particular, as a photoreceiver in optical data transmission systems employing beam waveguides.

FIG. 1 shows a known coupling arrangement composed of a carrier element 10 provided with a through hole 101 in which a beam waveguide 30 is disposed. A photodetector 20 is also fastened to the carrier element 10 to convert the light exiting from the beam waveguide 30 into an electrical current and/or voltage which is evaluated for the recovery of the data.

Such a coupling arrangement has the particular drawback that it requires a passage hole 101 having a diameter which is approximately 0.1 mm to 0.2 mm, that is small compared to the thickness of the carrier element, which is a few millimeters, if optical glass fibers are used as the beam waveguide 30. Such passage holes are difficult to manufacture and therefore expensive. Moreover, complicated techniques are required to optimally adjust the photodetector 20 since the position of the beam waveguide 30, which is generally subject to tolerance variations, must first be determined.

SUMMARY OF THE INVENTION

It is therefore an object of the invention to provide an optoelectrical coupling device which can be manufactured economically and which is suitable, in particular, for high data transmission rates.

The above and other objects are achieved, according to the invention, by the provision of an optoelectrical coupling arrangement composed of a carrier element having a side face and provided with at least one trough-shaped recess extending to the side face, at least one beam waveguide element fastened in the recess and presenting an end face positioned to lie in the region of the one side face of the carrier element, and at least one light-to-electrical signal transducer fastened to the side face and having a light-sensitive region positioned to recieve a substantial portion of the light emanating from the end face of the beam waveguide element.

One advantage of the invention is that the coupling arrangement can be made to be mechanically insensitive and low in electrical capacitance.

The invention will now be described in greater detail with reference to the drawings showing several embodiments.

DESCRIPTION OF THE PREFERRED EMBODIMENTS

The invention is based on the fact that it is much simpler, from an engineering point of view, and therefore more economical, to produce narrow trough-like recesses and/or slits than to drill or bore deep passage holes having a small diameter. For example, a recess, or slit, of a length of 10 mm, a width of 0.25 mm and a depth of 5 mm can be easily sawed or cut into a metal piece, while it is comparatively difficult to drill a hole, for example, having a depth of 5 mm and a diameter of 0.25 mm into the same metal piece.

Figure 1:
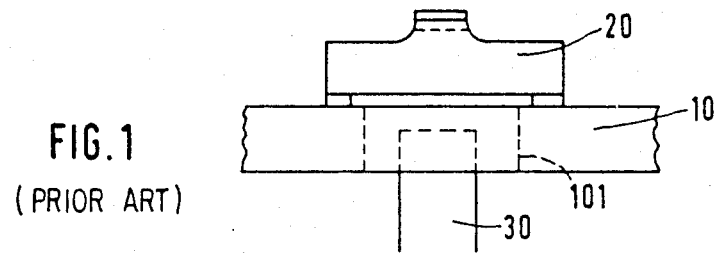
FIG. 1 is an elevational view of a prior art coupling arrangement which has already been described above.
Figure 2A:
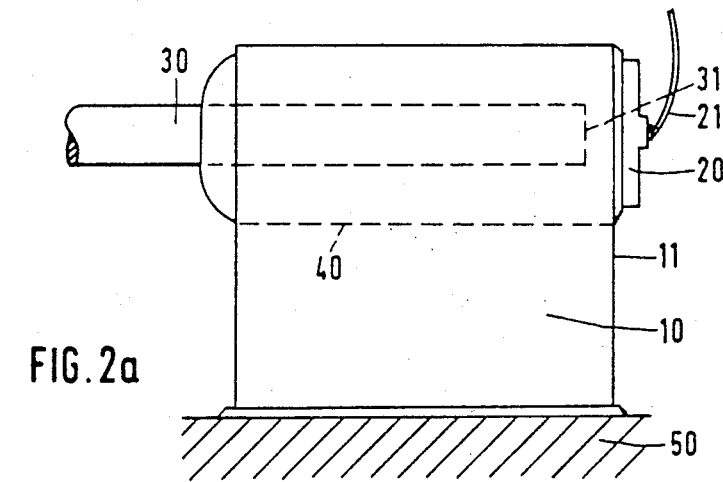
FIGS. 2a and 2b are side and end elevational views, respectively, of a first embodiment of the invention.
Figure 2B:
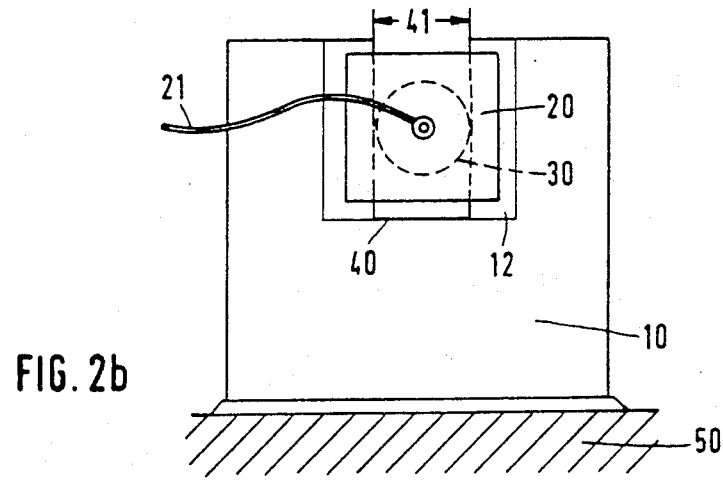

In the embodiment shown in FIGS. 2a and 2b, a recess 40, for example a continuous slit having a width 41 of 0.25 mm and a depth of 0.6 mm is cut into a first side face of a carrier element 10, e.g. a metal cube having an edge length of 1.2 mm. The recess 40 extends essentially parallel to one edge of the carrier element 10 and is disposed essentially in the center of the first side face. The recess 40 intersects a second side face 11 so that there the cross-sectional area of the recess 40 becomes visible, as shown in FIG. 2b. This cross section now advantageously serves as an alignment aid for fastening a photodetector 20, e.g. a semiconductor photodiode chip measuring 0.5 mm along each edge and which is attached to the second side face 11 in such a manner, e.g. glued or soldered at 12 in an electrically conductive manner, that the light-sensitive region of the photodetector 20 lies essentially in the center of the cross section of recess 40 and faces the recess 40.

A beam waveguide 30, e.g. an optical glass fiber, can now be placed into this recess 40 and can be fixed there, e.g. by gluing or cementing, in such a way that light emanating from its end face 31 impinges essentially completely on the light-sensitive region of the photodetector 20.

The described arrangement can now be fastened, e.g. glued, soldered, etc., in a simple, electrically conductive manner, e.g. on a so-called circuit board 50, so that one electrical connection is established from the photodetector 20 to board 50 through the carrier body 10, while the other electrical connection is established, for example, with the aid of a thin gold wire 21, for example with a diameter of $12\mu$, e.g. by bonding. The described embodiment has low electrical capacitance so that such an optical receiver permits a high data transmission rate.

The exemplarily stated geometrical dimensions of the recess as well as of the carrier element can, of course, be varied and depend on the beam waveguide as well as on the photodetector employed.

Figure 3:
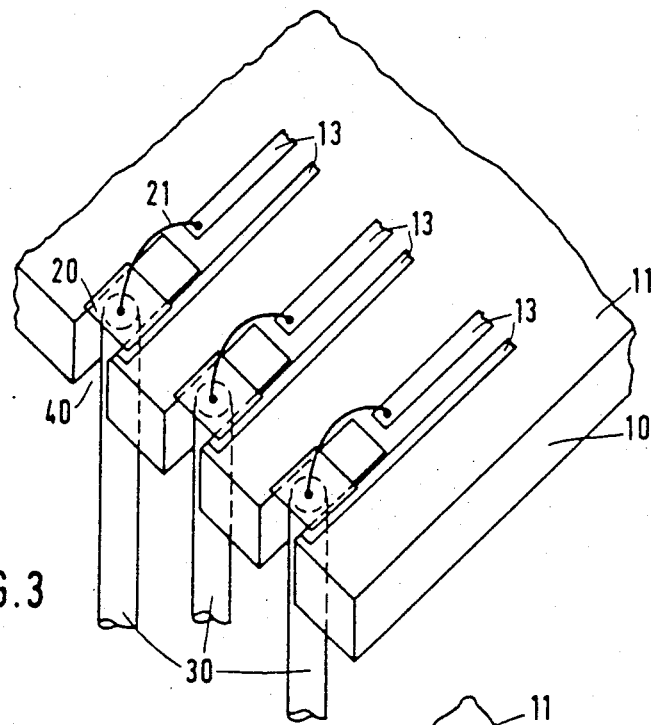
FIGS. 3 and 4 are perspective views of further embodiments of the invention.
Figure 4:
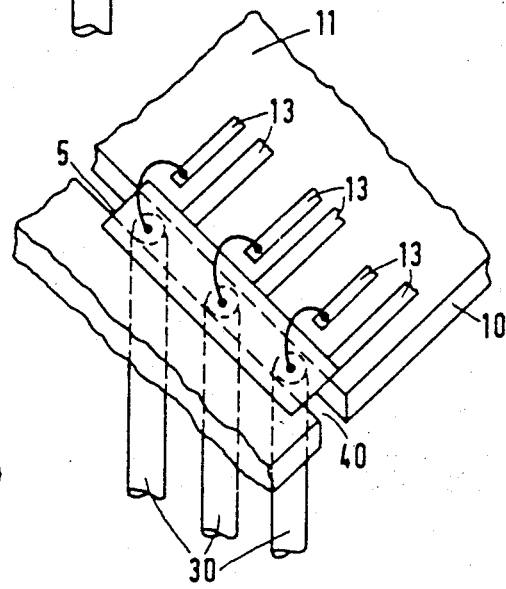

In the exemplary embodiments of the invention shown in FIGS. 3 and 4 one or a plurality of recesses 40 are applied in a plate-shaped carrier element in such a manner that a plurality of beam waveguides 30 can be fastened simultaneously in these recesses. Similar to the embodiment of FIGS. 2a and 2b, a plurality of photoconductors 20, as shown in FIG. 3, or only one photodetector array 5 including a plurality of photodetectors, as shown in FIG. 4, are attached to the side face 11 of the carrier element 10. Moreover, on side face 11 there are also provided electrical leads 13, e.g. conductor paths, which provide electrical connections for the photodetectors. In this case, element 10 would be of insulating material or face 11 thereof would be provided with a suitable insulating layer. Such an arrangement makes it possible, for example, to integrate an electrical network on the carrier element 10, according to the hybrid technique, so that the optical signals arriving through the beam waveguides can be converted to electrical signals for further processing.

It will be understood that the above description of the present invention is susceptible to various modifications, changes and adaptations, and the same are intended to be comprehended within the meaning and range of equivalents of the appended claims.

What is claimed is:

1. Optoelectrical coupling arrangement comprising: a carrier element having a side face and provided with at least one trough-shaped recess extending to the side face; at least one optical fiber element fastened in the recess, having a longitudinal axis perpendicular to said side face, and presenting an end face positioned to lie in the region of said side face of said carrier element; and at least one photodetector having transverse dimensions smaller than that of said side face and fastened to said side face via opposed edges of said photodetector so that said photodetector is located within the boundaries of said side face, and having a light-sensitive region positioned parallel to said side face to receive a substantial portion of the light emanating from said end face of said optical fiber element, and wherein said carrier element comprises at least one electrical conductive path connected electrically with said photodetector.

2. Coupling arrangement as defined in claim 1 wherein said optical fiber element is a glass fiber.

3. Coupling arrangement as defined in claim 1 or 2 wherein said photodetector is a semiconductor element.

4. Coupling arrangement as defined in claim 1 or 2 wherein, at least in the region of said recess, said electrical conductive path is constituted by at least a portion of said side face.

5. Coupling arrangement as defined in claim 1 or 2 wherein at least said side face of said carrier element is composed of electrical insulating material.

6. Coupling arrangement as defined in claim 5 wherein said conductive path is disposed on said side face.

7. Coupling arrangement as defined in claim 1 or 2 wherein said recess has a width which is insignificantly larger than the diameter of said optical fiber element.

8. Coupling arrangement as defined in claim 1 or 2 wherein there are at least two said optical fiber elements in said recess and at least two said photodetectors fastened to said side face and each positioned to receive a substantial portion of the light emanating from said end face of a respective one of said optical fiber elements.

9. Coupling arrangement as defined in claim 1 or 2 wherein said photodetector is part of an integrated semiconductor device.

10. Coupling arrangement as defined in claim 1 wherein said recess has a rectangular cross section parallel to said side face.

11. Coupling arrangement as defined in claim 1 wherein: said photodetector is a semiconductor chip having first and second oppposed surfaces, a light-sensitive region and first electrical connection means disposed at said first surface, and second electrical connection means disposed at said second surface; and said electrical conductive path is disposed on said side face and is electrically connected to said first electrical connection means of said photodetector.

* * * * *